(12) United States Patent
Jiang et al.

(10) Patent No.: US 10,784,469 B2
(45) Date of Patent: Sep. 22, 2020

(54) MASK AND FABRICATING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Liang Jiang, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 221 days.

(21) Appl. No.: 15/580,150

(22) PCT Filed: Nov. 27, 2017

(86) PCT No.: PCT/CN2017/113079
§ 371 (c)(1),
(2) Date: Aug. 10, 2018

(87) PCT Pub. No.: WO2019/075857
PCT Pub. Date: Apr. 25, 2019

(65) Prior Publication Data
US 2020/0020890 A1   Jan. 16, 2020

(30) Foreign Application Priority Data

Oct. 18, 2017 (CN) .......................... 2017 1 0973499

(51) Int. Cl.
C23C 14/04 (2006.01)
C23C 16/04 (2006.01)
(Continued)

(52) U.S. Cl.
CPC ............ *H01L 51/56* (2013.01); *C23C 14/042* (2013.01); *C23C 14/24* (2013.01); *C23C 16/042* (2013.01);
(Continued)

(58) Field of Classification Search
None
See application file for complete search history.

(56) References Cited

U.S. PATENT DOCUMENTS 3,241,519 A * 3/1966 Lloyd ................... C23C 14/042
                                                            118/720
5,822,038 A * 10/1998 Slater ..................... G03B 27/20
                                                             355/22
(Continued)

FOREIGN PATENT DOCUMENTS

CN   201464800    5/2010
CN   104561892    4/2015
(Continued)

*Primary Examiner* — Binu Thomas
(74) *Attorney, Agent, or Firm* — Hemisphere Law, PLLC; Zhigang Ma (57) ABSTRACT

A mask and a fabricating method thereof are provided. In the mask, a plurality of pairs of grooves corresponding to the plurality of mask sheets are disposed on a mask frame, each of the mask sheets includes a portion overlapping with a corresponding pair of grooves, and includes a plurality of pairs of locking fittings; each of the locking fittings includes an engaging portion and two connecting portions disposed on two sides thereof; the engaging portion are engaged with the corresponding grooves to clamp a portion of the mask sheet overlapping with the grooves, and the connecting portions are detachably connected with the mask frame to fix the plurality of mask sheets on the mask frame; during the rework process of the mask, only the locking fittings need to
(Continued)

be removed to separate the mask frame and the mask sheets, so the mask frame does not need to be polished.

11 Claims, 8 Drawing Sheets

(51) Int. Cl.
    *H01L 51/00*     (2006.01)
    *H01L 51/56*     (2006.01)
    *C23C 14/24*     (2006.01)
    *B05C 21/00*     (2006.01)

(52) U.S. Cl.
    CPC ......... *B05C 21/005* (2013.01); *H01L 51/0011* (2013.01)

(56) References Cited

U.S. PATENT DOCUMENTS

| | | | | |
|---|---|---|---|---|
| 2002/0102754 | A1* | 8/2002 | Fujimori | C23C 14/042 118/504 |
| 2004/0020435 | A1* | 2/2004 | Tsuchiya | C23C 14/042 118/723 VE |
| 2004/0021410 | A1* | 2/2004 | Stagnitto | C23C 14/042 313/407 |
| 2011/0220019 | A1* | 9/2011 | Lee | C23C 14/042 118/504 |
| 2013/0263782 | A1* | 10/2013 | Wang | C23C 14/042 118/720 |
| 2014/0033975 | A1* | 2/2014 | Oh | C23C 14/042 118/504 |
| 2015/0007767 | A1* | 1/2015 | Ko | C23C 14/042 118/504 |
| 2015/0068456 | A1* | 3/2015 | Kuriyama | C23C 14/042 118/505 |
| 2015/0101536 | A1* | 4/2015 | Han | C23C 14/042 118/721 |
| 2016/0260935 | A1 | 9/2016 | Lee | |
| 2016/0348227 | A1* | 12/2016 | Wu | C23C 14/04 |
| 2017/0222145 | A1* | 8/2017 | Kim | H01L 51/0011 |

FOREIGN PATENT DOCUMENTS

| | | |
|---|---|---|
| CN | 204509446 | 7/2015 |
| CN | 105063551 | 11/2015 |
| CN | 105200370 | 12/2015 |
| CN | 106702318 | 5/2017 |
| JP | 2016166380 | 9/2016 |

\* cited by examiner

MASK AND FABRICATING METHOD THEREOF

RELATED APPLICATIONS

The present application is a National Phase of International Application Number PCT/CN2017/113079, filed on Nov. 27, 2017, and claims the priority of China Application 201710973499.8, filed on Oct. 18, 2017.

FIELD OF THE DISCLOSURE

The disclosure relates to the field of display technology, and in particular, to a mask and a fabricating method thereof.

BACKGROUND

The organic light emitting diode (OLED) display apparatus is recognized by the industry as the most promising display device due to having many advantages such as self-luminousness, low driving voltage, high luminous efficiency, short response time, high resolution and contrast, viewing angle nearly 180°, wide temperature range, and capability of achieving the flexible display and large-area panchromatic display.

According to the driving mode, OLED can be classified into a passive matrix OLED (PMOLED) and an active matrix OLED (AMOLED), i.e., direct addressing and thin film transistor matrix addressing. Among them, AMOLED has a matrix arrangement of pixels, belonging to the active display type; due to the high luminous efficiency, AMOLED is usually used for high-definition large-size display apparatus.

The OLED generally includes a substrate, an anode disposed on the substrate, a hole injection layer disposed on the anode, a hole transport layer disposed on the hole injection layer, and a light emitting layer disposed on the hole transport layer, an electron transport layer on the light emitting layer, and a cathode disposed on the electron transport layer. The light-emitting principle of an OLED display device is that semiconductor materials and organic light-emitting materials emit light through carrier injection and recombination under an electric field. Specifically, an OLED device generally adopts an ITO pixel electrode and a metal electrode as an anode and a cathode of the device respectively. Under a certain voltage, electrons and holes are injected from the cathode and the anode into the electron transport layer and the hole transport layer respectively. The electrons and holes migrate to the light emitting layer through the electron transport layer and the hole transport layer respectively, and meet in the light emitting layer to form excitons to excite the light-emitting molecules, which emit visible light through radiation relaxation.

Figure 1:
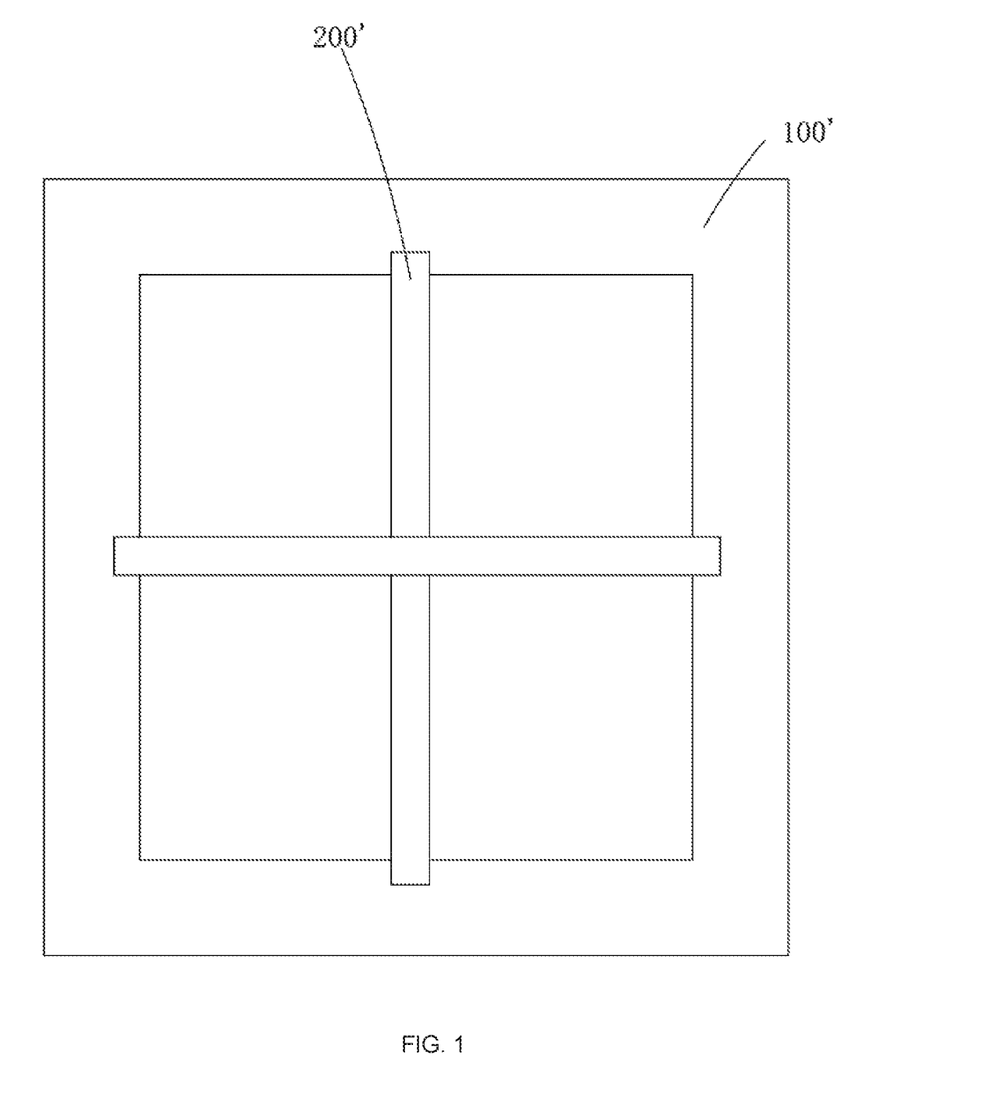
FIG. 1 is a schematic view of the structure of a conventional mask.

The OLED display devices can be classified into two categories of large size, and medium and small size by panel size, the large-sized OLED display devices typically emit white light by a white OLED and achieve full color display through a color filter (CF) layer. In the prior art, a mask is generally used to evaporating each of the OLED functional layers; for a large-size OLED display adopting a white OLED and a color filter layer structure, only the mask needs to be used to define the boundary of the effective area (AA area) in the process of evaporating the white OLED. Referring to FIG. 1, which is a schematic view of a structure of a conventional mask for manufacturing a large-size OLED display; the mask includes a mask frame 100' and a plurality of mask sheets 200' fixed on the mask frame 100'. The plurality of mask sheet 200' are connected to the mask frame 100 jointly define a plurality of opening regions for evaporation. In the prior art, the mask sheet 200' is generally fixed on the mask frame 100' by welding. During the process of using the mask, the mask needs to be cleaned regularly to ensure the quality of the product. After being cleaned several times, the mask sheets need to be removed from the mask frame for rework. Since the existing mask welding the mask sheets and the mask frame by welding, the welding position on the mask frame needs to be polished after the mask sheet is removed from the mask frame, so as to ensure the flatness of the mask frame and the reliability of re-welding the mask sheets. The operation is complicated, and the thickness of the mask frame is reduced due to polishing; therefore, after rework process 2 to 3 times; the mask frame must be scrapped, so that the mask frame has a shorter life; for the mask used to make large-size OLED displays, the fabrication of the mask frame and the rework process of the mask are the main part of the cost, and the complex rework process and the short life of the mask frame will greatly increase the cost of the product.

SUMMARY

The object of the disclosure is to provide a mask, having high efficiency of the rework process and a long service life.

Another object of the disclosure is to provide a fabricating method of a mask, having the advantages of high efficiency of a rework process and a long service life of the mask.

In order to achieve the object, the disclosure provides a mask frame, a plurality of mask sheets disposed on the mask frame, and a plurality of pairs of locking fittings mounted on the mask frame and respectively fixing a plurality of mask sheets on the mask frame;

the mask frame includes an opening, a plurality of pairs of grooves are disposed on a top surface or an outer surface of the mask frame, and two grooves of each pair of grooves are respectively located on two sides of the opening; each of the locking fittings includes an engaging portion and two connecting portions disposed on two sides of the engaging portion; each of the mask sheets includes a portion overlapping with a corresponding pair of grooves, and the engaging portion of the pair of locking fittings corresponding to each mask is respectively engaged with the corresponding pair of grooves to clamp a portion where the mask overlaps with the pair of grooves, and simultaneously, two connecting portions of each of the locking fitting are respectively detachably connected to the mask frame so as to fix a plurality of mask sheets on the mask frame.

A plurality of first protrusions are disposed on a top surface of an engaging portion of the locking fitting, and a plurality of second protrusions engaged with the plurality of first protrusions are disposed on a bottom surface of the groove.

The plurality of pairs of grooves are located at an edge of a top surface of the mask frame.

A portion of the mask sheet overlapping with a corresponding pair of grooves is located at two ends of the mask sheet.

each of the two connecting portions of the locking fitting includes a through hole, and the mask frame includes a threaded hole corresponding to the through hole, and a locking screw is connected with a thread of the threaded hole through the through hole so that the connecting portion is detachably connected to the mask frame.

The disclosure further provides a fabricating method of a mask, including the following steps of:

step S1: providing a mask frame;

The mask frame includes an opening, a plurality of pairs of grooves respectively corresponding to the mask sheets are disposed on the top surface or the outer surface of the mask frame, two grooves of each pair of grooves are respectively located on two sides of the opening;

step S2: providing a plurality of mask sheets and a plurality of pairs of locking fittings corresponding to the plurality of mask sheets respectively;

the plurality of mask sheets respectively correspond to a plurality of pairs of grooves;

each of the locking fittings includes an engaging portion and two connecting portions disposed on two sides of the engaging portion;

step S3: fitting each mask into closely with the top surface of the mask frame, and overlapping a portion of each mask with a corresponding pair of grooves;

step S4: engaging the engaging portion of the pair of locking fittings corresponding to each of the mask are respectively with the corresponding pair of grooves to clamp the portion where the mask overlaps with the pair of grooves, and simultaneously, detachably connecting two connecting portions of each of the locking fitting respectively with the mask frame so as to fix a plurality of mask sheets on the mask frame to obtain a mask.

A plurality of first protrusions are disposed on a top surface of an engaging portion of the locking fitting, and a plurality of second protrusions engaged with the plurality of first protrusions are disposed on a bottom surface of the groove.

The plurality of pairs of grooves are located at an edge of a top surface of the mask frame.

A portion of the mask coinciding with a corresponding pair of grooves of the mask is located at two ends of the mask.

Each of the two connecting portions of the locking fitting includes a through hole, a threaded hole corresponding to the through hole is disposed on the mask frame;

In step S4, by connecting a locking screw with a thread of the threaded hole through the through hole, the connecting portion is detachably connected to the mask frame.

The disclosure further provides a mask, including a mask frame, a plurality of mask sheets disposed on the mask frame, and a plurality of pairs of locking fittings mounted on the mask frame and respectively fixing a plurality of mask sheets on the mask frame;

the mask frame includes an opening, a plurality of pairs of grooves are disposed on a top surface or an outer surface of the mask frame, and two grooves of each pair of grooves are respectively located at two sides of the opening; each of the locking fittings includes an engaging portion and two connecting portions disposed on two sides of the engaging portion; each of the mask sheets includes a portion overlapping with a corresponding pair of grooves, the engaging portion of the pair of locking fittings corresponding to each mask are respectively engaged with the corresponding pair of grooves to clamp the portion where the mask overlaps with the pair of grooves, and simultaneously, two connecting portions of each of the locking fitting are respectively detachably connected to the mask frame so as to fix a plurality of mask sheets on the mask frame;

wherein a plurality of first protrusions are disposed on a top surface of an engaging portion of the locking fitting, and a plurality of second protrusions engaged with the plurality of first protrusions are disposed on a bottom surface of the groove;

the plurality of pairs of grooves are located at an edge of a top surface of the mask frame.

a portion of the mask sheet overlapping with a corresponding pair of grooves is located at two ends of the mask sheet;

and each of the two connecting portions of the locking fitting includes a through hole, and the mask frame includes a threaded hole corresponding to the through hole, and a locking screw is connected with a thread of the threaded hole through the through hole so that the connecting portion is detachably connected to the mask frame.

The beneficial effect of the disclosure is that the disclosure provides a mask, a plurality of pairs of grooves corresponding to the plurality of mask sheets are disposed on the mask frame, each of the mask sheets includes a portion overlapping with a corresponding pair of grooves, and include a plurality of pairs of locking fittings corresponding to the plurality of mask sheets simultaneously; each of the locking fittings includes an engaging portion and two connecting portions disposed on two sides of the engaging portion; the engaging portion of the locking fittings are used to engage with the corresponding grooves to clamp the portion where the mask overlaps with the grooves, and simultaneously, the connecting portions of the locking fitting are detachably connected with the mask frame, thereby fixing a plurality of mask sheets to the mask frame; during the process of reworking the mask, only the locking fittings need to be removed from the mask frame to complete the separation of the mask frame and the mask, and therefore, the mask frame does not need to be polished, reducing the complexity of the rework process, and extending the service life of the mask frame simultaneously, facilitating to reduce product costs. The fabricating method of the mask provided by the disclosure has the advantages of high efficiency in the rework process and a long service life of the fabricated mask.

BRIEF DESCRIPTION OF THE DRAWINGS

For further understanding of the features and technical contents of the disclosure, reference should be made to the following detailed description and accompanying drawings of the disclosure. However, the drawings are for reference only and are not intended to limit the disclosure.

In the drawings.

DETAILED DESCRIPTION OF PREFERRED EMBODIMENTS

To further illustrate the technical means adopted by the disclosure and the effects thereof, the following describes in detail the preferred embodiments of the disclosure and the accompanying drawings.

Referring to FIGS. 2 to 8, the disclosure provides a mask including a mask frame 100, a plurality of mask sheets 200 disposed on the mask frame 100, and a plurality of mask sheets 200 mounted on the mask frame 100, and a plurality of pairs of locking fittings 300 mounted on the mask frame 100 and respectively fixing a plurality of mask sheets 200 on the mask frame 100.

Figure 3:
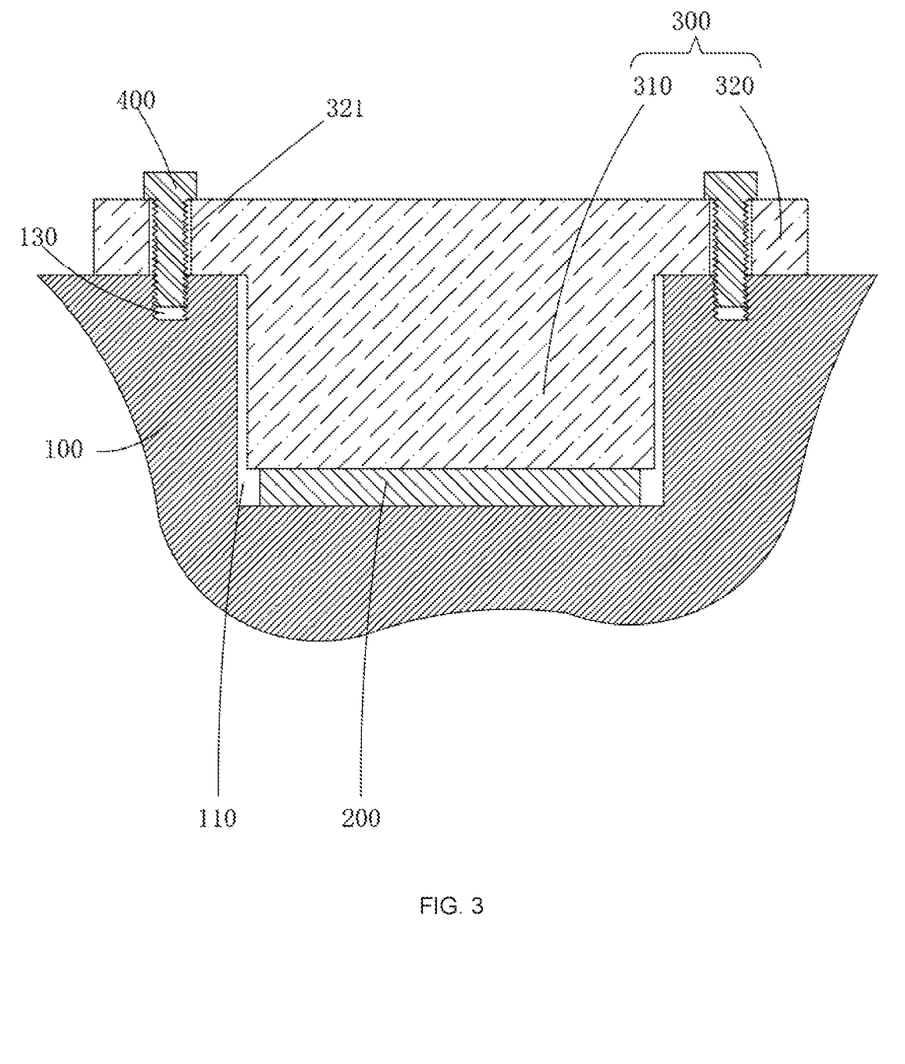
FIG. 3 is a cross-sectional view taken along a line AA in FIG. 2.
Figure 4:
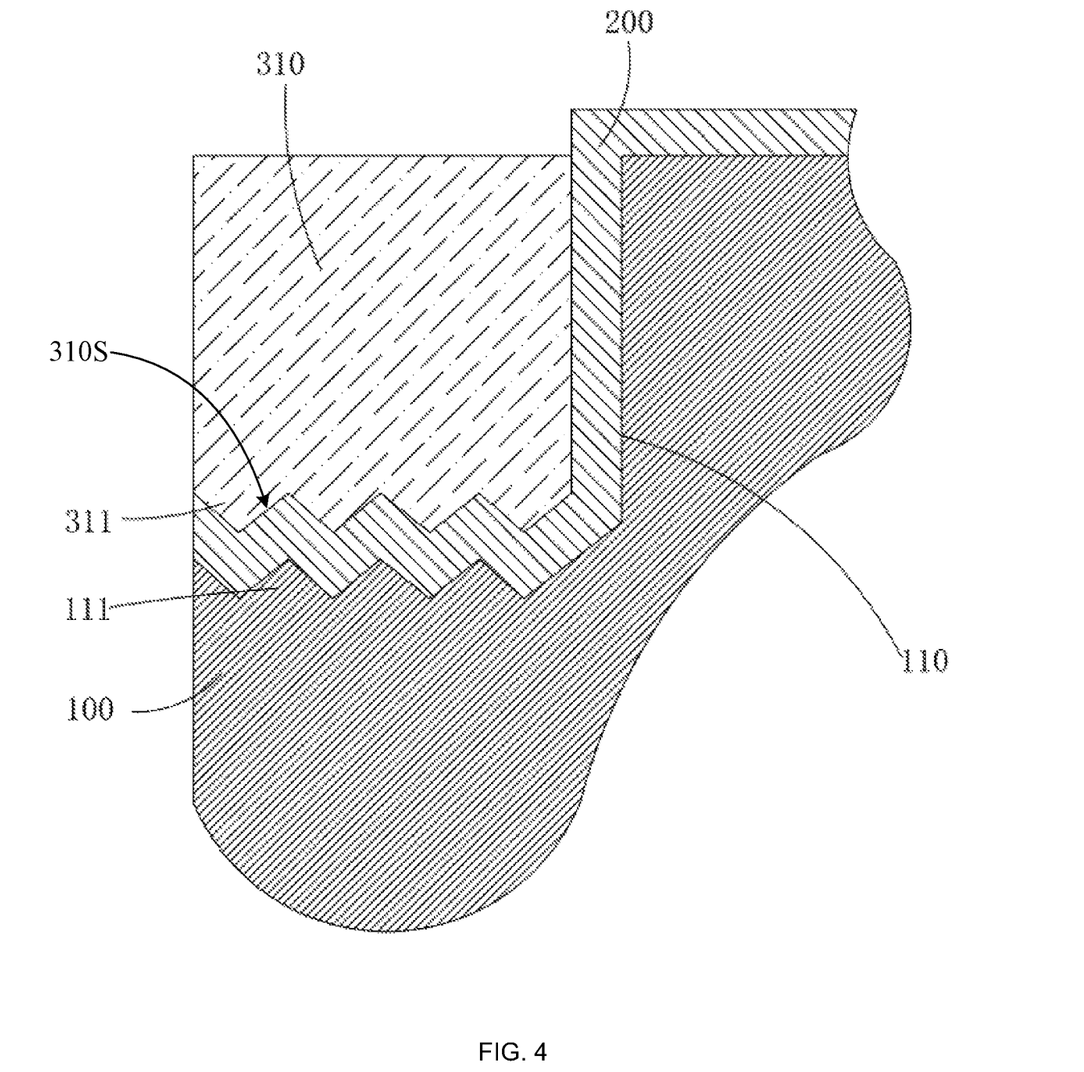
FIG. 4 is a schematic cross-sectional view taken along a line BB in FIG. 2.
Figure 5:
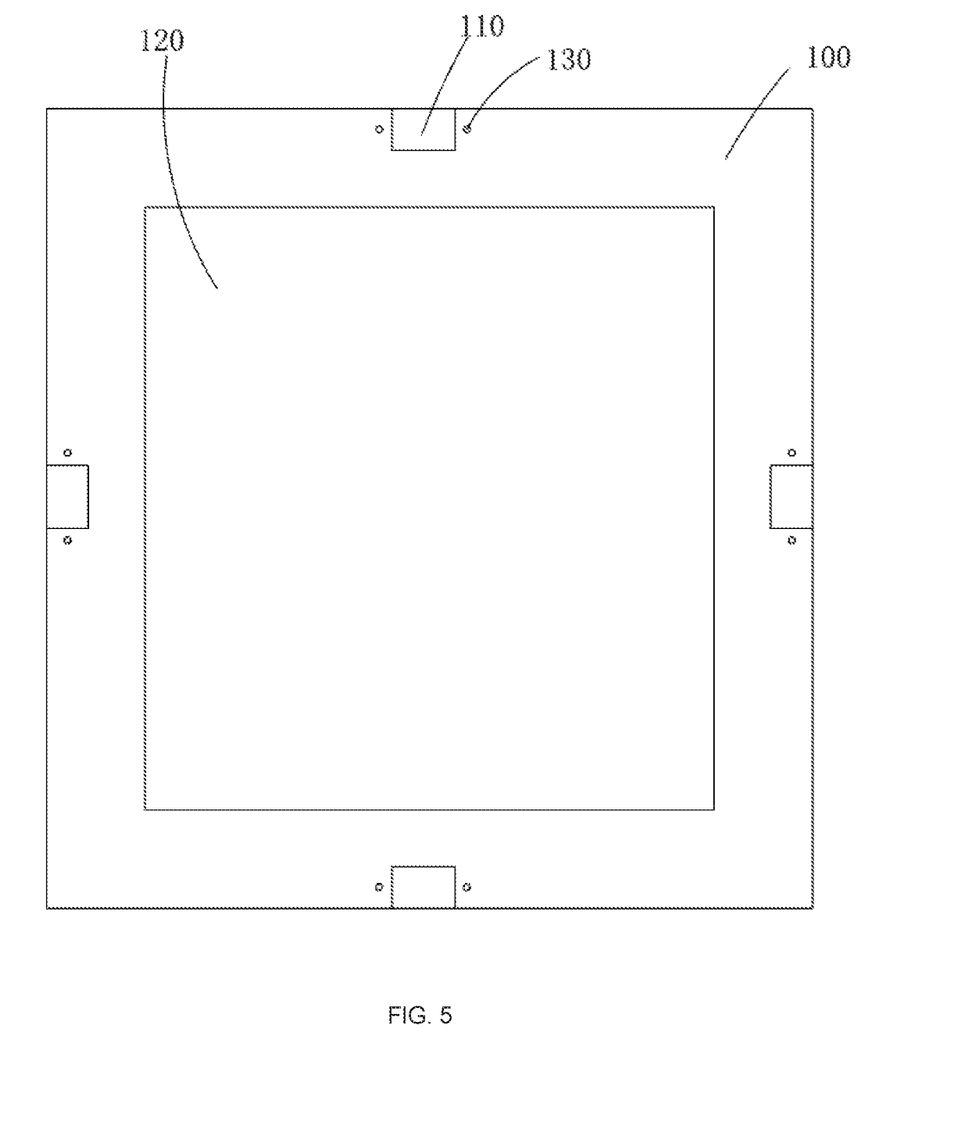
FIG. 5 is a schematic structural view of a mask frame of a mask of the disclosure.
Figure 6:
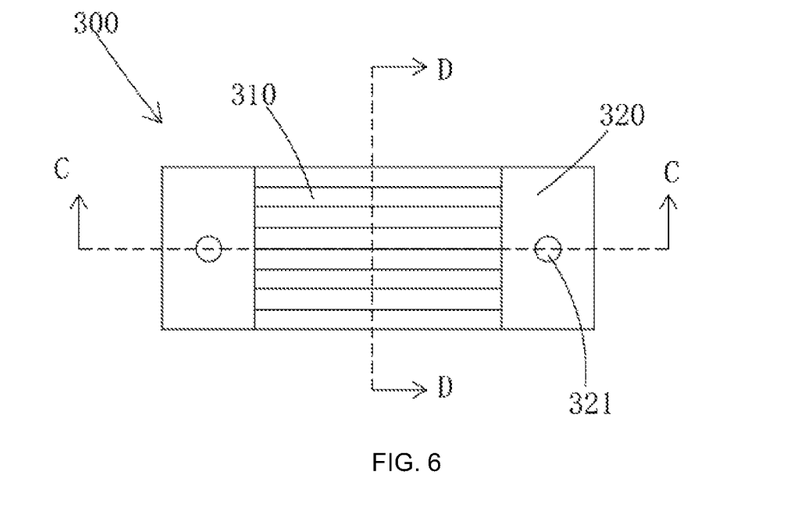
FIG. 6 is a schematic top view of a locking fitting of a mask of the disclosure.
Figure 7:
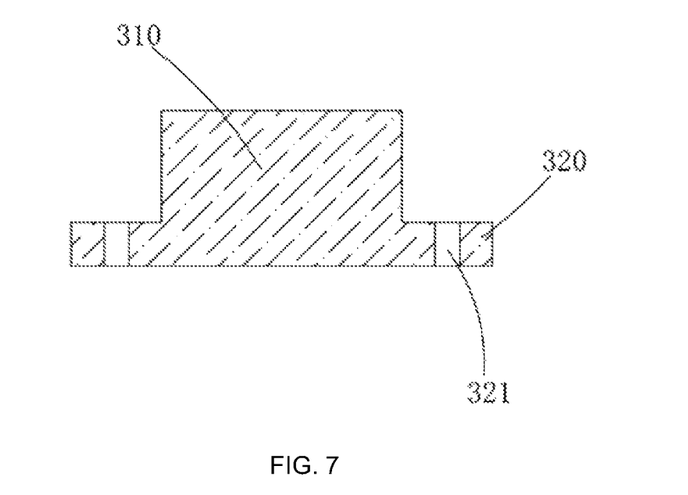
FIG. 7 is a schematic cross-sectional view taken along a line CC in FIG. 6.
Figure 8:
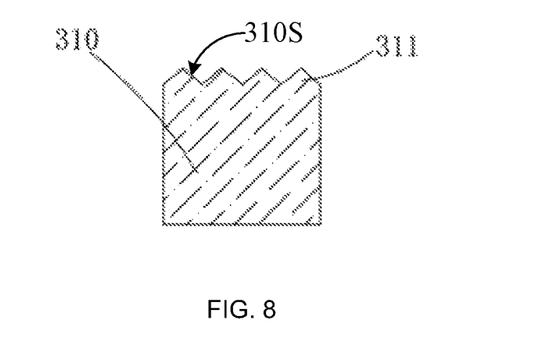
FIG. 8 is a cross-sectional view taken along line DD in FIG. 6.

Referring to FIG. 5, the mask frame 100 includes an opening 120, a plurality of pairs of grooves 110 respectively corresponding to the plurality of mask sheets 200 are disposed on the top surface or the outer surface of the mask frame 100, and two grooves 110 in each pair of grooves 110 are respectively located on two sides of the opening 120; referring to FIGS. 6 to 8, each locking fitting 300 includes an engaging portion 310 and two connecting portions 320 disposed on two sides of the engaging portion 310; referring to FIGS. 3 and 4, each of the mask sheets 200 includes a portion overlapping with a corresponding pair of grooves 110, the engaging portion 310 of the pair of locking fittings 300 corresponding to each of the mask sheets 200 is respectively engaged with the corresponding pair of grooves 110 to clamp the portion where the mask sheet 200 overlaps with the pair of grooves 110, and simultaneously, two connecting portions 320 of each of the locking fitting 300 are respectively detachably connected to the mask frame 100 so as to fix a plurality of mask sheets 200 on the mask frame 100.

Specifically, the position and the number of the grooves 110 on the top surface or the outer surface of the mask frame 100 are designed according to the opening pattern of the mask to be obtained.

Specifically, in the embodiment shown in FIGS. 2 to 5, the plurality of grooves 110 are all located on the top edge of the mask frame 100, and the mask sheets 200 are integrally located on the top surface of the mask frame 100. It can be understood that when the plurality of pairs of grooves 110 are located on the outer side of the mask frame 100, a portion of the plurality of mask sheets 200 is located on the top surface of the mask frame 100 and a portion thereof is bent to the outer side of the mask frame 100, and the portion of the mask sheet 200 bent to the outer surface of the mask frame 100 is overlapped with the corresponding groove 110, so as to be clamped by the locking fittings 300 and the groove 110.

Preferably, a portion of the mask sheet 200 overlapping with a corresponding pair of grooves 110 is located at two ends of the mask sheets 200.

Specifically, referring to FIGS. 3, 6 and 7, each of the two connecting portions 320 of the locking fitting 300 includes a through hole 321, a threaded hole 130 corresponding to the through hole 321 is disposed on the mask frame 100, a locking screw 400 is connected with a thread of the threaded hole 130 through the through hole 321 so that the connecting portion 320 is detachably connected to the mask frame 100. Preferably, the locking screw 400 is a vacuum screw. Of course, other commonly used detachable connections may also be used to connect the connecting portion 320 with the mask frame 100 without affecting the implementation of the disclosure.

Preferably, a plurality of first protrusions 311 are disposed on a top surface 310S of an engaging portion 310 of the locking fitting 300, and a plurality of second protrusions 111 engaging with the plurality of first protrusions 111 are disposed at a bottom surface of the groove 110. By respectively disposing the first protrusions 311 and the second protrusions 111 on the top surface 310S of the engaging portion 310 and the bottom surface of the groove 110, the mask sheet 200 can be effectively prevented from sliding during use after the mask sheets 200 is clamped by engaging portion 310 and the groove 110. Preferably, the plurality of first protrusions 311 and the plurality of second protrusions 111 are engaged with each other. Of course, the top surface of the engaging portion 310 of the locking fitting 300 and the bottom surface of the groove 110 may also be formed into other non-planar structures to prevent the mask sheet 200 from sliding during use without affecting the implementation of the disclosure.

It should be noted that the mask of the disclosure is used in the evaporation process of a large-size OLED display, by disposing a plurality of pairs of grooves 110 corresponding to the plurality of mask sheets 200 on the mask frame 100, each of the mask sheets 200 includes a portion overlapping with a corresponding pair of grooves 110, and by disposing a plurality of pairs of locking fittings 300 corresponding to the plurality of mask sheets 200 simultaneously, and by using the engaging portion of the locking fittings to engage with the corresponding grooves to clamp the portion where the mask overlaps with the grooves, and simultaneously, connecting the connecting portions of the locking fitting 300 with the mask frame 100 detachably, thereby fixing a plurality of mask sheets to the mask frame. When the mask frame 100 needs to be separated from the mask sheet 200 in the rework process after being cleaned several times, only the locking fittings 300 need to be removed from the mask frame 100 to complete the separation of the mask frame 100 and the mask sheets 200, and therefore, the mask frame 100 does not need to be polished, reducing the complexity of the rework process, and extending the service life of the mask frame 100 simultaneously, facilitating to reduce product costs.

Figure 9:
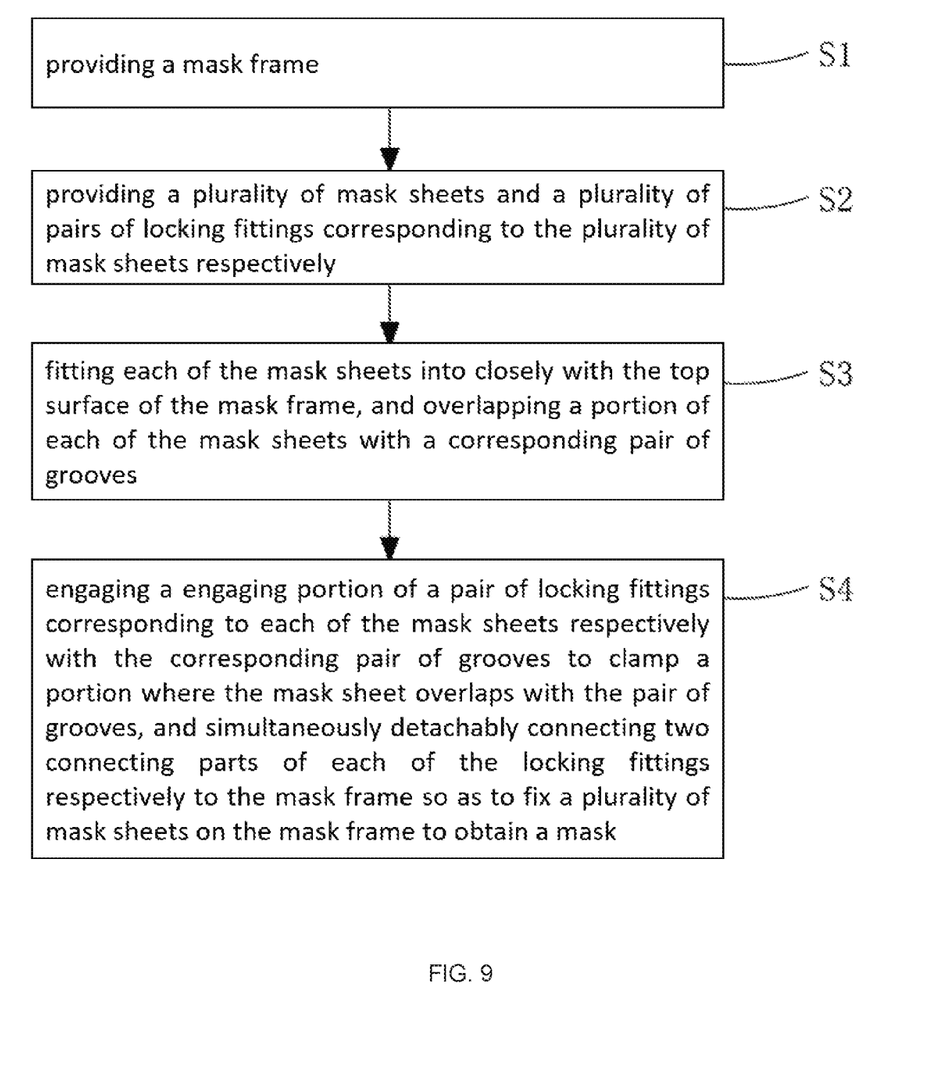
FIG. 9 is a flow chart of a fabricating method of a mask according to the disclosure.

Referring to FIG. 9, based on the same inventive concept, the disclosure also provides a fabricating method of a mask, including the steps of:

step S1: referring to FIG. 5, providing a mask frame 100; the mask frame 100 includes an opening 120, a plurality of pairs of grooves 110 are disposed on the top surface or the outer surface of the mask frame 100, and two grooves 110 of each pair of grooves 110 are respectively located at two sides of the opening 120.

Specifically, the position and the number of the grooves 110 on the top surface or the outer surface of the mask frame 100 are designed according to the opening pattern of the mask to be obtained.

Specifically, in the embodiment shown in FIG. 5, the plurality of pairs of grooves 110 are both located at the top surface edge of the mask frame 100. In other embodiments of the disclosure, the plurality of pairs of grooves 110 may also be located on the outer side of the mask frame 100.

Preferably, referring to FIG. 4, a plurality of second protrusions 111 are disposed on the bottom surface of the groove 110.

Step S2: referring to FIGS. 6 to 8, providing a plurality of mask sheets 200 and a plurality of pairs of locking fittings 300 respectively corresponding to the plurality of mask sheets 200;

the plurality of mask sheets 200 respectively correspond to the plurality of pairs of grooves 110;

each locking fitting 300 includes an engaging portion 310 and two connecting portions 320 disposed on two sides of the engaging portion 310.

Specifically, referring to FIGS. 6 and 7, each of the two connecting portions 320 of the locking fitting 300 includes a through hole 321. Referring to FIG. 5, the mask frame 100 includes a threaded hole 130 corresponding to the through hole 321.

Preferably, a plurality of first protrusions 311 engaged with the second protrusions 111 are disposed on the top surface of the engaging portion 310 of the locking fitting 300.

Figure 10:
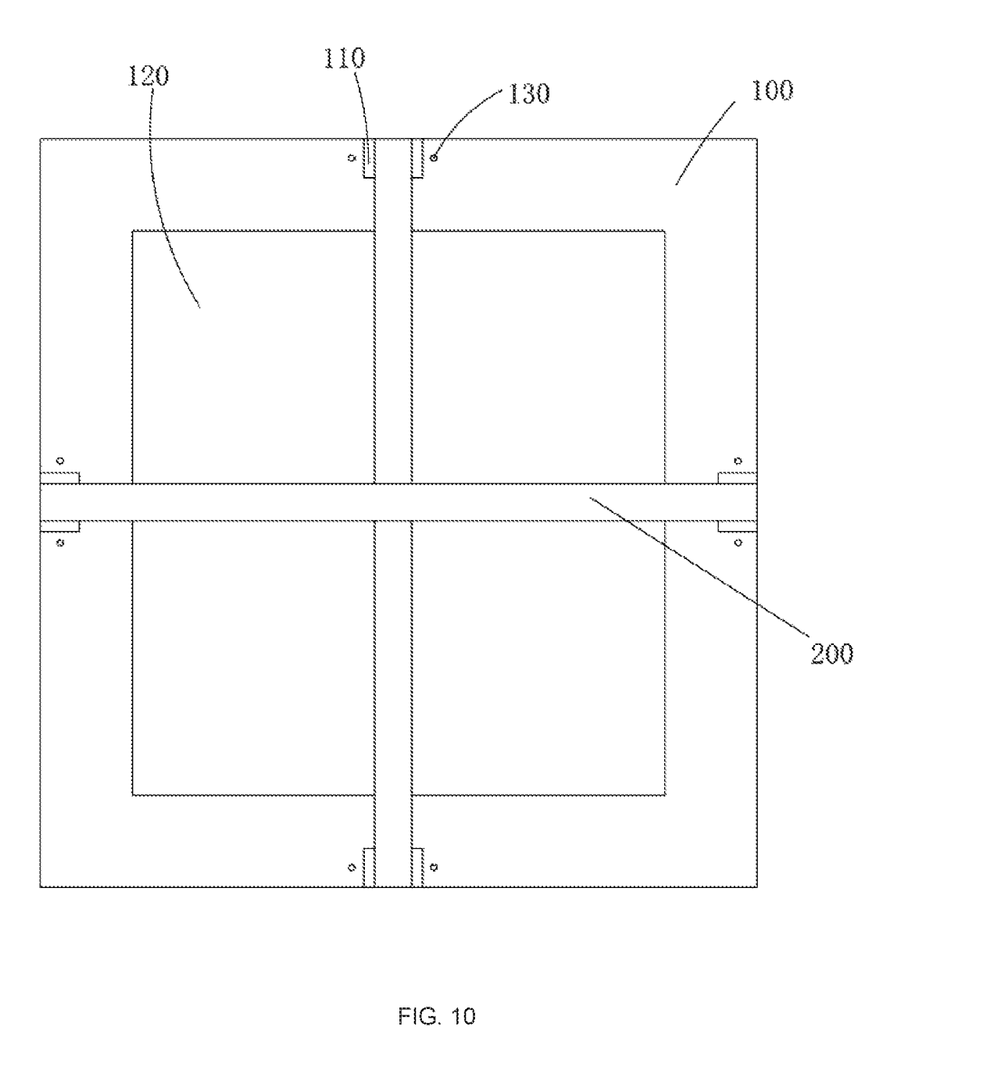
FIG. 10 is a schematic view of step S3 of fabricating method of a mask according to the disclosure.

Step S3: referring to FIG. 10, fitting each of the mask sheets 200 closely with the top surface of the mask frame 100 by a tension machine, and overlapping a portion of each of the mask sheets 200 with a corresponding pair of grooves 110.

Preferably, the portion of the mask sheet 200 overlapping with a corresponding pair of grooves 110 is located at two ends of the mask sheets 200.

Specifically, when the plurality of pairs of grooves 110 are disposed on the top surface of the mask frame 100, In step S3, the entire mask sheets 200 are closely fitted with the top surface of the mask frame 100 by using a tension machine; when the plurality of pairs of grooves 110 are disposed on the outer surface of the mask frame 100, In step S3, the portion of the mask sheets 200 is bent to the outer side of the mask frame 100 by using a tension machine, the portion of the mask sheet 200 bent to the outer side surface of the mask frame 100 is overlapped with the corresponding groove 110; meanwhile, other portions of the plurality of mask sheets 200 other than the portion bent to the outer side surface of the mask frame 100 are fitted closely with the top surface of the mask frame 100.

Figure 2:
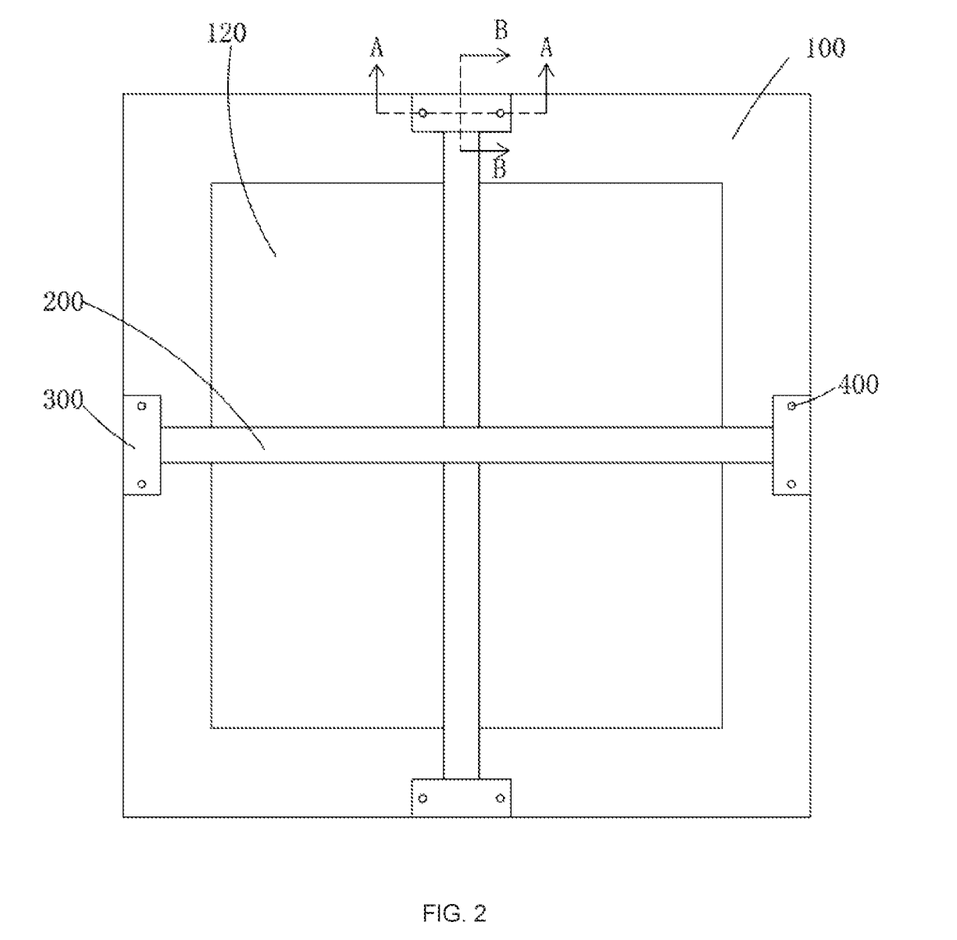
FIG. 2 is a schematic structural view of a mask of the disclosure.

Step S4: referring to FIG. 2 to FIG. 4, engaging the engaging portion 310 of the pair of locking fittings 300 corresponding to each of the mask sheets 200 respectively with the corresponding pair of grooves 110 to clamp the portion where the mask sheet 200 overlaps with the pair of grooves 110, and simultaneously, detachably connecting two connecting portions 320 of each of the locking fitting 300 respectively with the mask frame 100 so as to fix a plurality of mask sheets 200 on the mask frame 100 to obtain a mask.

Specifically, in step S4, by connecting a locking screw 400 with a thread of the threaded hole 130 through the through hole 321, the connecting portion 320 is detachably connected to the mask frame 100. Preferably, the locking screw 400 is a vacuum screw. Of course, other commonly used detachable connections may also be used to connect the connecting portion 320 with the mask frame 100 without affecting the implementation of the disclosure.

It should be noted that in a fabricating method of a mask according to the disclosure, by disposing the plurality of pairs of grooves 110 on the mask frame 100, and then fitting the plurality of mask sheets 200 corresponding to the plurality of grooves 110 with top surface of the mask frame 100, and overlapping the portion of each of the mask sheets 200 with the corresponding pair of grooves 110, and by using the engaging portion 310 of the pair of locking fittings 300 corresponding to each of the mask sheets 200 to engage with the corresponding pair of grooves 110 to clamp the portion where the mask sheet 200 overlaps with the pair of grooves 110, and simultaneously, connecting the connecting portions of the locking fitting 300 with the mask frame 100 detachably, thereby fixing a plurality of mask sheets 200 on the mask frame 100; when the mask frame 100 needs to be separated from the mask sheet 200 in the rework process after being cleaned several times, only the locking fitting 300 needs to be removed from the mask frame 100 to complete the separation of the mask frame 100 and the mask sheets 200, and therefore, the mask frame 100 does not need to be polished, reducing the complexity of the rework process, and extending the service life of the mask frame 100 simultaneously, facilitating to reduce product costs.

To sum up, in the mask of the disclosure, a plurality of pairs of grooves corresponding to the plurality of mask sheets are disposed on the mask frame, each of the mask sheets includes a portion overlapping with a corresponding pair of grooves, and includes a plurality of pairs of locking fittings corresponding to the plurality of mask sheets simultaneously; each of the locking fittings includes an engaging portion and two connecting portions disposed on two sides of the engaging portion; the engaging portion of the locking fittings are used to engage with the corresponding grooves to clamp the portion where the mask sheet overlaps with the grooves, and simultaneously, the connecting portions of the locking fitting are detachably connected with the mask frame, thereby fixing a plurality of mask sheets to the mask frame; during the process of reworking the mask, only the locking fittings need to be removed from the mask frame to complete the separation of the mask frame and the mask sheets, and therefore, the mask frame does not need to be polished, reducing the complexity of the rework process, and extending the life of the mask frame simultaneously, facilitating to reduce product costs. The fabricating method of the mask provided by the disclosure has the advantages of high efficiency in the rework process and a long service life of the fabricated mask.

As described above, it will be apparent to those skilled in the art that various other changes and modifications may be made in accordance with the technical solutions and technical concepts of the disclosure, and all such changes and modifications are subject to be included in the scope of protection of the appended claims.

What is claimed is:

1. A mask, comprising:
    a mask frame,
    a plurality of mask sheets disposed on the mask frame, and
    a plurality of pairs of locking fittings mounted on the mask frame and respectively fixing the plurality of mask sheets on the mask frame;
    wherein the mask frame comprises an opening, a plurality of pairs of grooves respectively corresponding to the plurality of mask sheets are disposed on a top surface or an outer surface of the mask frame, two grooves of each pair of grooves are respectively located at two sides of the opening; each of the locking fittings comprises an engaging portion and two connecting portions disposed on two sides of the engaging portion; each of the mask sheets comprises a portion overlapping with a corresponding pair of grooves, the engaging portions of each pair of locking fittings corresponding to each of the mask sheets are respectively engaged with the corresponding pair of grooves to clamp the portion of the mask sheet overlapping with the pair of grooves, and simultaneously two connecting portions of each of the locking fittings are detachably connected to the mask frame so as to fix the plurality of mask sheets on the mask frame.

2. The mask according to claim 1, wherein a plurality of first protrusions are disposed on a top surface of the engaging portion of the locking fitting, and a plurality of second protrusions engaged with the plurality of first protrusions are disposed on a bottom surface of each groove of the plurality of pairs of grooves.

3. The mask according to claim 1, wherein the plurality of pairs of grooves are located at an edge of the top surface of the mask frame.

4. The mask according to claim 1, wherein the portion of the mask sheet overlapping with the corresponding pair of grooves is located at two ends of the mask sheet.

5. The mask according to claim 1, wherein each of the two connecting portions of the locking fitting comprises a through hole, and the mask frame comprises a threaded hole corresponding to the through hole, and a locking screw is connected with a thread of the threaded hole through the through hole so that the connecting portion is detachably connected to the mask frame.

6. A fabricating method of a mask, comprising the steps of:
step S1: providing a mask frame;
the mask frame comprises an opening, a plurality of pairs of grooves are disposed on a top surface or an outer surface of the mask frame, and two grooves of each pair of grooves are respectively located on two sides of the opening;
step S2: providing a plurality of mask sheets and a plurality of pairs of locking fittings corresponding to the plurality of mask sheets respectively;
the plurality of mask sheets respectively correspond to a plurality of pairs of grooves;
each of the locking fittings comprises an engaging portion and two connecting portions disposed on two sides of the engaging portion;
step S3: fitting each of the mask sheets closely with the top surface of the mask frame, and overlapping a portion of each of the mask sheets with a corresponding pair of grooves;
step S4: engaging the engaging portions of each pair of locking fittings corresponding to each of the mask sheets respectively with the corresponding pair of grooves to clamp the portion of the mask sheet overlapping with the pair of grooves, and simultaneously, detachably connecting two connecting portions of each of the locking fittings respectively to the mask frame so as to fix the plurality of mask sheets on the mask frame to obtain a mask.

7. The fabricating method of the mask according to claim 6, wherein a plurality of first protrusions are disposed on a top surface of the engaging portion of the locking fitting, and a plurality of second protrusions engaged with the plurality of first protrusions are disposed on a bottom surface of each groove of the plurality of pairs of grooves.

8. The fabricating method of the mask according to claim 6, wherein the plurality of pairs of grooves are located at an edge of the top surface of the mask frame.

9. The fabricating method of the mask according to claim 6, wherein a portion of the mask sheet overlapping with the corresponding pair of grooves is located at two ends of the mask sheet.

10. The fabricating method of the mask according to claim 6, wherein each of the two connecting portions of the locking fitting comprises a through hole, and the mask frame comprises a threaded hole corresponding to the through hole;
In step S4, by connecting a locking screw with a thread of the threaded hole through the through hole, the connecting portion is detachably connected to the mask frame.

11. A mask, comprising:
a mask frame,
a plurality of mask sheets disposed on the mask frame, and
a plurality of pairs of locking fittings mounted on the mask frame and respectively fixing the plurality of mask sheets on the mask frame;
wherein the mask frame comprises an opening, a plurality of pairs of grooves respectively corresponding to the plurality of mask sheets are disposed on a top surface or an outer surface of the mask frame, two grooves of each pair of grooves are respectively located on two sides of the opening; each of the locking fittings comprises a engaging portion and two connecting portions disposed on two sides of the engaging portion; each of the mask sheets comprises a portion overlapping with a corresponding pair of grooves, the engaging portions of each pair of locking fittings corresponding to each of the mask sheets are respectively engaged with the corresponding pair of grooves to clamp the portion of the mask sheet overlapping with the pair of grooves, and simultaneously, two connecting portions of each of the locking fitting are detachably connected to the mask frame so as to fix the plurality of mask sheets on the mask frame;
wherein a plurality of first protrusions are disposed on a top surface of the engaging portion of the locking fitting, and a plurality of second protrusions engaged with the plurality of first protrusions are disposed on a bottom surface of each groove of the plurality of pairs of grooves;
wherein the plurality of pairs of grooves are located at an edge of the top surface of the mask frame;
wherein a portion of the mask sheet overlapping with the corresponding pair of grooves is located at two ends of the mask sheet;
wherein each of the two connecting portions of the locking fitting comprises a through hole, and the mask frame comprises a threaded hole corresponding to the through hole, and a locking screw is connected with a thread of the threaded hole through the through hole so that the connecting portion is detachably connected to the mask frame.

* * * * *